(12) United States Patent
Huang

(10) Patent No.: US 12,308,318 B2
(45) Date of Patent: May 20, 2025

(54) SEMICONDUCTOR DEVICE STRUCTURE WITH BARRIER PORTION

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taiepi (TW)

( * ) Notice: Subject to any disclaimer, the term of this patent is extended or adjusted under 35 U.S.C. 154(b) by 505 days.

(21) Appl. No.: 17/831,591

(22) Filed: Jun. 3, 2022

(65) Prior Publication Data
US 2023/0395505 A1    Dec. 7, 2023

(51) Int. Cl.
*H01L 23/532* (2006.01)
*H01L 21/768* (2006.01)

(52) U.S. Cl.
CPC .. *H01L 23/53238* (2013.01); *H01L 21/76843* (2013.01); *H01L 21/76877* (2013.01); *H01L 23/53266* (2013.01)

(58) Field of Classification Search
CPC ......... H01L 23/53238; H01L 23/53266; H01L 21/76843; H01L 21/76877
See application file for complete search history.

(56) References Cited

U.S. PATENT DOCUMENTS

| | | | | |
|---|---|---|---|---|
| 6,500,749 B1 * | 12/2002 | Liu | ............... | H01L 21/76834 |
| | | | | 257/E21.585 |
| 9,576,892 B2 * | 2/2017 | Chi | ................... | H01L 23/528 |
| 9,748,169 B1 | 8/2017 | Murray et al. | | |
| 10,204,829 B1 * | 2/2019 | Amanapu | ......... | H01L 21/76831 |
| 10,312,188 B1 * | 6/2019 | Srivastava | ............ | H01L 23/528 |
| 2002/0192940 A1 | 12/2002 | Lee et al. | | |
| 2004/0224497 A1 * | 11/2004 | Barth | ................ | H01L 21/76849 |
| | | | | 257/E21.585 |
| 2006/0264030 A1 | 11/2006 | Fujiki | | |

(Continued)

FOREIGN PATENT DOCUMENTS

| | | |
|---|---|---|
| TW | 202115794 A | 4/2021 |
| TW | 202205675 A | 2/2022 |
| TW | 202221860 A | 6/2022 |

OTHER PUBLICATIONS

Office Action and Search Report mailed on Aug. 18, 2023 related to Taiwanese Application No. 111131564.

(Continued)

*Primary Examiner* — Nathan W Ha
(74) *Attorney, Agent, or Firm* — Xuan Zhang

(57) ABSTRACT

A semiconductor device structure includes a first dielectric layer disposed over a semiconductor substrate, and a first conductive layer disposed in the first dielectric layer. The semiconductor device structure also includes a cap layer disposed over the first conductive layer, and a first barrier layer separating the first conductive layer and the cap layer from the first dielectric layer. The semiconductor device structure further includes a barrier portion disposed over the cap layer, wherein the barrier portion includes CuMgO, and a second dielectric layer disposed over the first dielectric layer and covering the barrier portion. In addition, the semiconductor device structure includes a conductive plug disposed over the cap layer and surrounded by the second dielectric layer. A bottom portion of the conductive plug is surrounded by the barrier portion.

17 Claims, 22 Drawing Sheets

(56) References Cited

U.S. PATENT DOCUMENTS

| | | | |
|---|---|---|---|
| 2007/0080463 A1 | 4/2007 | Furuya | |
| 2007/0197012 A1* | 8/2007 | Yang | H01L 23/53295 257/E21.585 |
| 2008/0057698 A1 | 3/2008 | Ishigami | |
| 2009/0020883 A1* | 1/2009 | Nomura | H01L 21/76831 257/774 |
| 2010/0330394 A1* | 12/2010 | He | H10N 50/01 427/535 |
| 2011/0049716 A1 | 3/2011 | Yang et al. | |
| 2011/0121300 A1* | 5/2011 | Miyairi | H01L 29/04 257/59 |
| 2014/0291819 A1* | 10/2014 | Barth | H01L 21/76852 257/659 |
| 2015/0069620 A1* | 3/2015 | Chi | H01L 21/76868 438/653 |
| 2016/0064517 A1* | 3/2016 | Su | H01L 21/76847 438/653 |
| 2016/0181151 A1* | 6/2016 | Chapple-Sokol | H01L 23/53295 257/751 |
| 2023/0197613 A1* | 6/2023 | Majhi | H01L 29/42392 257/401 |
| 2023/0223341 A1* | 7/2023 | Bao | H01L 21/76849 257/211 |
| 2023/0395428 A1* | 12/2023 | Huang | H01L 21/76855 |

OTHER PUBLICATIONS

Office Action and Search Report mailed on Oct. 11, 2024 related to U.S. Appl. No. 17/831,594.

Office Action and Search Report mailed on Dec. 19, 2024 related to U.S. Appl. No. 17/831,594.

\* cited by examiner

SEMICONDUCTOR DEVICE STRUCTURE WITH BARRIER PORTION

TECHNICAL FIELD

The present disclosure relates to a semiconductor device structure, and more particularly, to a semiconductor device structure with a barrier portion.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a first conductive layer disposed in the first dielectric layer. The semiconductor device structure also includes a cap layer disposed over the first conductive layer, and a first barrier layer separating the first conductive layer and the cap layer from the first dielectric layer. The semiconductor device structure further includes a barrier portion disposed over the cap layer, wherein the barrier portion includes CuMgO, and a second dielectric layer disposed over the first dielectric layer and covering the barrier portion. In addition, the semiconductor device structure includes a conductive plug disposed over the cap layer and surrounded by the second dielectric layer. A bottom portion of the conductive plug is surrounded by the barrier portion.

In an embodiment, a bottom surface and sidewalls of the first conductive layer are covered by the first barrier layer, and the first barrier layer includes Ta, TaN, or a combination thereof. In an embodiment, the cap layer is disposed in the first dielectric layer. In an embodiment, the cap layer includes CuMg, and the cap layer is in direct contact with the barrier portion. In an embodiment, the cap layer is separated from the first dielectric layer and the second dielectric layer.

In an embodiment, a top surface of the barrier portion is higher than a top surface of the first dielectric layer.

In an embodiment, the semiconductor device structure further includes a second barrier layer separating the conductive plug from the second dielectric layer, and a third barrier layer disposed over the second dielectric layer and covering the second barrier layer and the conductive plug. In an embodiment, the second barrier layer and the third barrier layer include Ti, TiN, or a combination thereof. In an embodiment, the second barrier layer is in direct contact with the barrier portion and the cap layer. In an embodiment, the semiconductor device structure further includes a second conductive layer disposed over the third barrier layer, wherein the second conductive layer is electrically connected to the first conductive layer.

In another embodiment of the present disclosure, a semiconductor device structure is provided. The semiconductor device structure includes a first dielectric layer disposed over a semiconductor substrate, and a first conductive layer disposed in the first dielectric layer. The semiconductor device structure also includes a first barrier layer covering sidewalls and a bottom surface of the first conductive layer, and a cap layer disposed over the first conductive layer and surrounded by the first barrier layer. The semiconductor device structure further includes a barrier portion disposed over the cap layer, and a second dielectric layer disposed over the first dielectric layer and covering the barrier portion. In addition, the semiconductor device structure includes a second conductive layer disposed over the second dielectric layer, and a conductive plug disposed in the second dielectric layer electrically connecting the second conductive layer to the first conductive layer.

In an embodiment, a thickness of the cap layer is greater than a thickness of the barrier portion. In an embodiment, the first barrier layer and the barrier portion include different materials. In an embodiment, a top surface of the barrier portion is higher than a top surface of the first barrier layer. In an embodiment, the cap layer includes CuMg, and the barrier portion includes CuMgO. In an embodiment, the semiconductor device structure further includes a second barrier layer covering sidewalls and a bottom surface of the conductive plug, wherein the second barrier layer is in direct contact with the barrier portion and the cap layer.

In an embodiment, the semiconductor device structure further includes a third barrier layer separating the second conductive layer from the second dielectric layer, wherein the conductive plug and the second barrier layer are covered by and in direct contact with the third barrier layer. In an embodiment, a top surface of the barrier portion is higher than a bottom surface of the second barrier layer. In an embodiment, the top surface of the barrier portion is higher than a bottom surface of the conductive plug. In an embodiment, a top surface of the cap layer is higher than the bottom surface of the second barrier layer.

In yet another embodiment of the present disclosure, a method for preparing a semiconductor device structure is provided. The method includes forming a first dielectric layer over a semiconductor substrate, and forming a first opening in the first dielectric layer. The method also includes forming a first conductive layer and a first barrier layer in the first opening. The first conductive layer is separated from the first dielectric layer by the first barrier layer. The method further includes partially removing the first conductive layer to form a recess, and filling the recess with a cap material. A portion of the cap material protrudes from the first dielectric layer. In addition, the method includes forming a second dielectric layer over the first dielectric layer. The portion of the cap material is converted into a barrier portion during the forming the second dielectric layer.

In an embodiment, the portion of the cap material protruding from the first dielectric layer is oxidized to form the barrier portion. In an embodiment, the cap material includes CuMg, and the barrier portion includes CuMgO. In an embodiment, before forming the second dielectric layer, a first distance between a bottom surface of the cap material and a top surface of the first dielectric layer is greater than a second distance between a top surface of the cap material and the top surface of the first dielectric layer. In an embodiment, after forming the second dielectric layer, a thickness of a remaining portion of the cap material is greater than a thickness of the barrier portion. In an embodiment, the remaining portion of the cap material is surrounded by and in direct contact with the first barrier layer.

In an embodiment, the method further includes forming a second opening in the second dielectric layer to expose the barrier portion, forming a second barrier layer lining the second opening, and filling a remaining portion of the second opening with a conductive plug. In an embodiment, the barrier portion is partially removed during the forming the second barrier layer. In an embodiment, the cap layer is partially removed during the forming the second barrier layer. In an embodiment, the second barrier layer is formed by a sputtering process. In an embodiment, the method further includes forming a third barrier layer over the second dielectric layer, and forming a second conductive layer over the third barrier layer, wherein the second conductive layer is electrically connected to the first conductive layer.

Embodiments of a semiconductor device structure and method for preparing the same are provided in the disclosure. In some embodiments, the semiconductor device structure includes a first conductive layer disposed in a first dielectric layer, a cap layer disposed over the first conductive layer, and a first barrier layer separating the first conductive layer and the cap layer from the first dielectric layer. In some embodiments, the semiconductor device structure also includes a barrier portion disposed over the cap layer. The barrier portion may function as a diffusion barrier to eliminate the diffusion and reaction between the cap layer and a second dielectric layer over the barrier portion. The material of the barrier portion may be selected to have a low contact resistivity, such as lower than the contact resistivity of tantalum (Ta). As a result, the performance of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
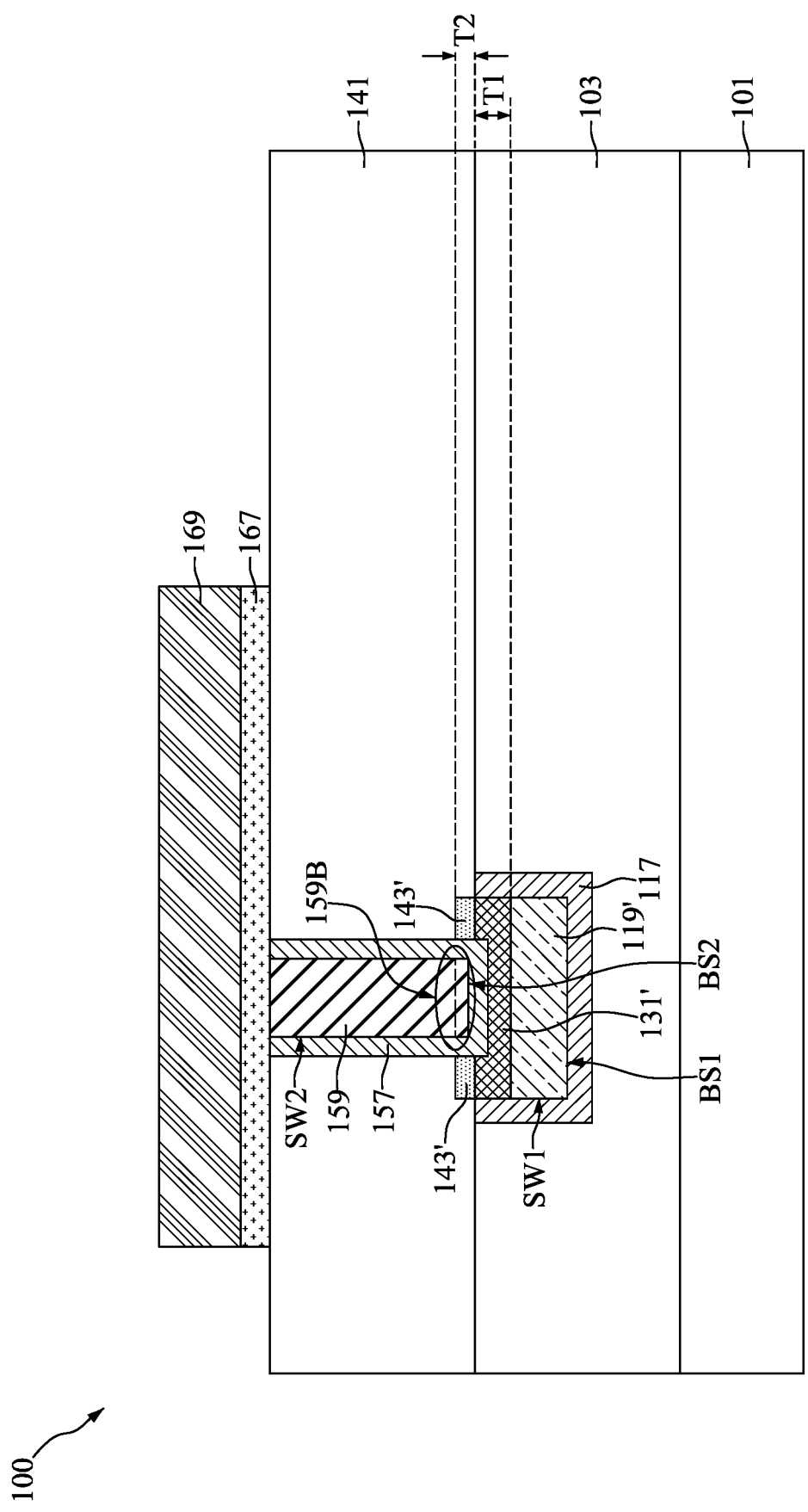
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a first dielectric layer 103 disposed over a semiconductor substrate 101, in accordance with some embodiments. In some embodiments, the semiconductor device structure 100 also includes a first conductive layer 119', a cap layer 131', and a first barrier layer 117 disposed in the first dielectric layer 103.

In some embodiments, the cap layer 131' is disposed over the first conductive layer 119', and the cap layer 131' and the first conductive layer 119' are separated from the first dielectric layer 103 by the first barrier layer 117. In some embodiments, the sidewalls SW1 and the bottom surface BS1 of the first conductive layer 119' are covered by the first barrier layer 117. Moreover, the semiconductor device structure 100 includes a barrier portion 143' disposed over the cap layer 131', in accordance with some embodiments.

In some embodiments, the barrier portion 143' is covered by a second dielectric layer 141 disposed over the first dielectric layer 103. In some embodiments, the barrier portion 143' is in direct contact with the cap layer 131'. In some embodiments, the cap layer 131' is separated from the first dielectric layer 103 by the first barrier layer 117. In some embodiments, the cap layer 131' is separated from the second dielectric layer 141 by the barrier portion 143'.

In addition, the cap layer 131' has a thickness T1, the barrier portion 143' has a thickness T2. In some embodiments, the thickness T1 of the cap layer 131' is greater than the thickness T2 of the barrier portion 143'. In some embodiments, the semiconductor device structure 100 includes a second barrier layer 157 and a conductive plug 159 disposed in the second dielectric layer 141. In some embodiments, the conductive plug 159 is separated from the second dielectric layer 141 by the second barrier layer 157.

In some embodiments, the sidewalls SW2 and the bottom surface BS2 of the conductive plug 159 are covered by the second barrier layer 157. Moreover, the second barrier layer 157 is in direct contact with the barrier portion 143' and the cap layer 131', in accordance with some embodiments. In some embodiments, a bottom portion 159B of the conductive plug 159 is surrounded by the barrier portion 143'.

In some embodiments, the semiconductor device structure 100 includes a third barrier layer 167 disposed over the second dielectric layer 141, and a second conductive layer 169 disposed over the third barrier layer 167. In some embodiments, the third barrier layer 167 covers and in direct contact with the second barrier layer 157 and the conductive plug 159. In some embodiments, the second conductive layer 169 is electrically connected to the first conductive layer 119'.

In some embodiments, the cap layer 131' includes CuMg, and the barrier portion 143' includes CuMgO. In some embodiments, the cap layer 131' is formed by depositing a cap material, and the barrier portion 143' is formed by converting a portion of the cap material protruding from the first dielectric layer 103 during the formation of the second dielectric layer 141. For example, the portion of the cap material protruding from the first dielectric layer 103 is oxidized to form the barrier portion 143', and the remaining portion of the cap material becomes the cap layer 131'.

As mentioned above, the barrier portion 143' and the second dielectric layer 141 can be formed simultaneously in the same process steps. Therefore, processing time and costs can be reduced. In addition, since the material of the barrier portion 143' is selected to have a low contact resistivity (Rc), such as lower than the contact resistivity of tantalum (Ta), a conductive path through the cap layer 131' exhibits improved electrical connectivity. As a result, the performance of the semiconductor device structure 100 can be improved.

Figure 2:
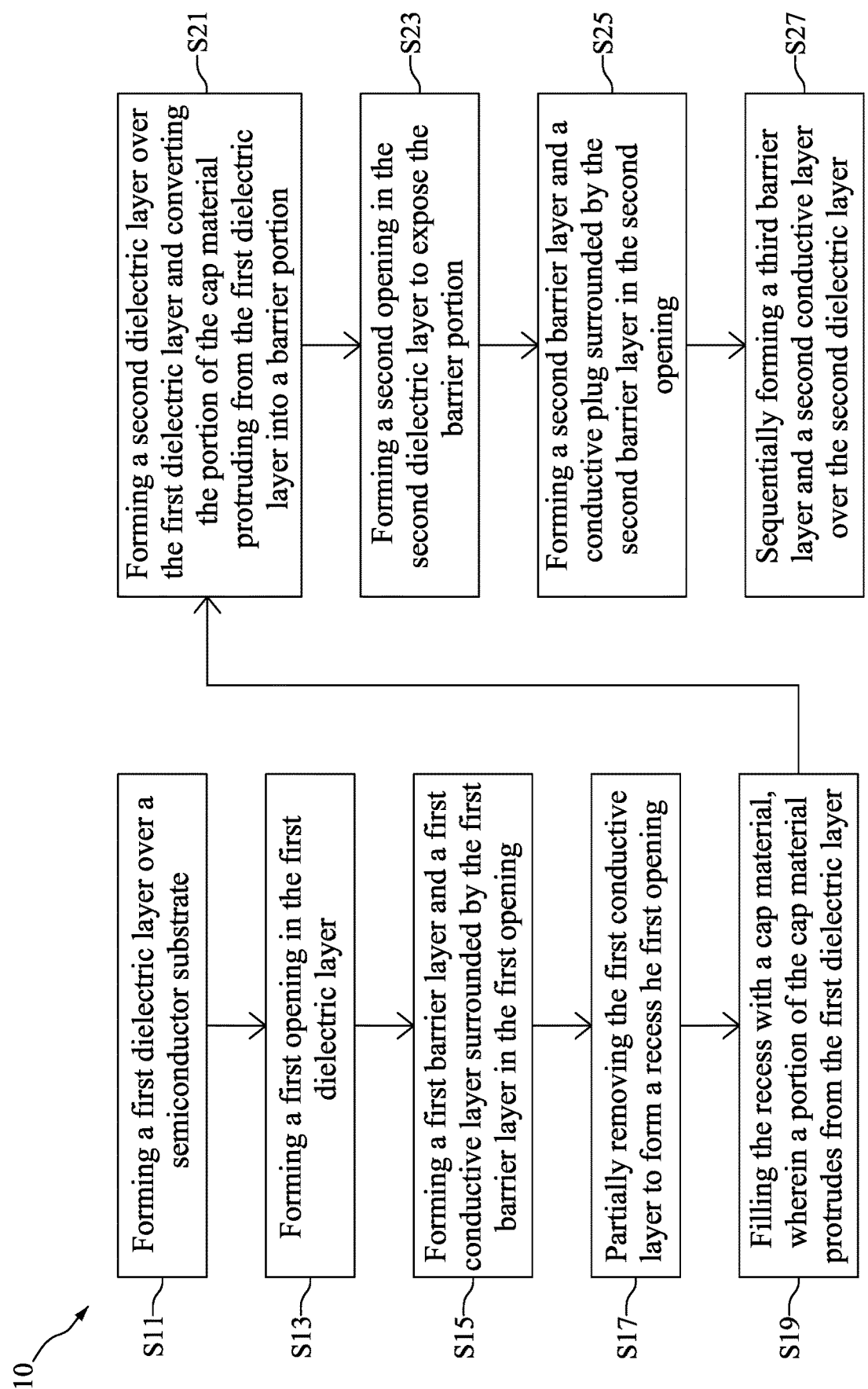
FIG. 2 is a flow diagram illustrating a method for preparing a semiconductor device structure, in accordance with some embodiments.

FIG. 2 is a flow diagram illustrating a method 10 for preparing the semiconductor device structure 100, and the method 10 includes steps S11, S13, S15, S17, S19, S21, S23, S25, and S27, in accordance with some embodiments. The steps S11 to S27 of FIG. 2 are elaborated in connection with the following figures.

Figure 3:
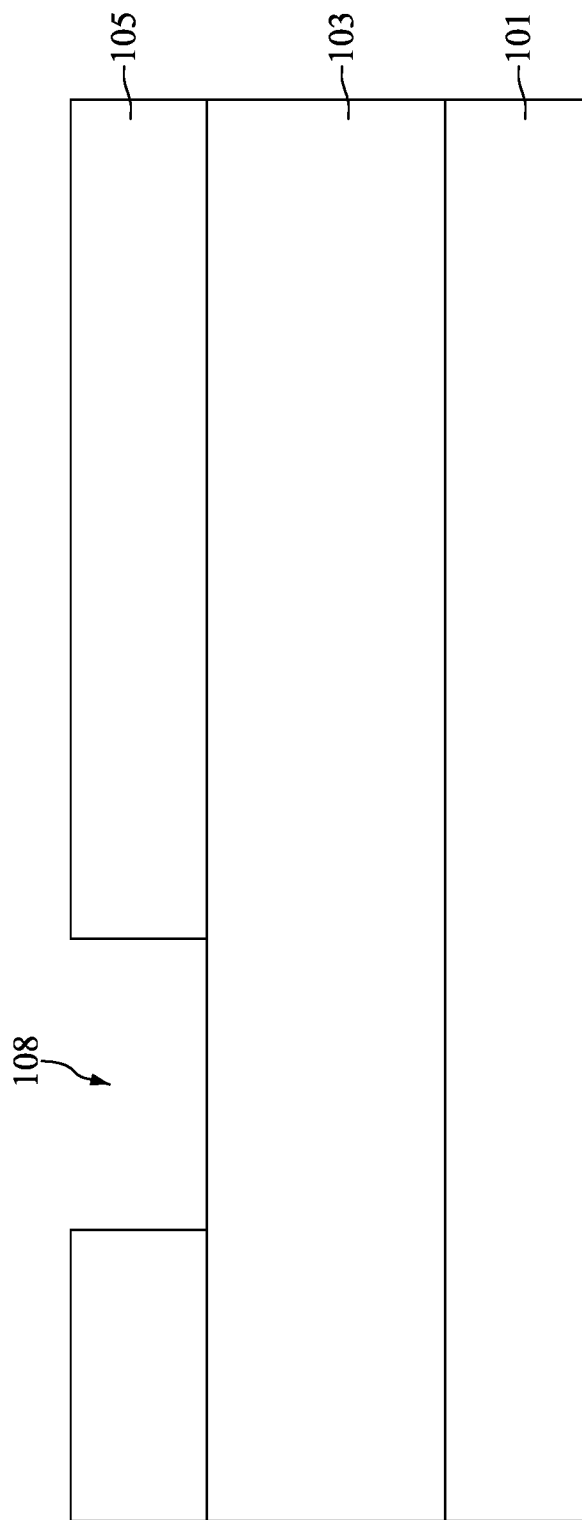
FIG. 3 is a cross-sectional view illustrating an intermediate stage of sequentially forming a first dielectric layer and a patterned mask over a semiconductor substrate during the formation of the semiconductor device structure, in accordance with some embodiments.

FIGS. 3-22 are cross-sectional views illustrating intermediate stages of forming the semiconductor device structure 100, in accordance with some embodiments. As shown in FIG. 3, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 is formed over the semiconductor substrate 101, as shown in FIG. 3 in accordance with some embodiments. The respective step is illustrated as the step S11 in the method 10 shown in FIG. 2. In some embodiments, the first dielectric layer 103 is made of silicon oxide, silicon nitride, silicon oxynitride, a low-k dielectric material or another suitable material. The first dielectric layer 103 may be formed by a deposition process, such as a chemical vapor deposition (CVD) process, a physical vapor deposition (PVD) process, an atomic layer deposition (ALD) process, a spin-on coating process, or another suitable method.

Then, still referring to FIG. 3, a patterned mask 105 with an opening 108 is formed over the first dielectric layer 103. In some embodiments, the first dielectric layer 103 is partially exposed by the opening 108. In some embodiments, the first dielectric layer 103 and the patterned mask 105 include different materials so that the etching selectivities may be different in the subsequent etching process.

Figure 4:
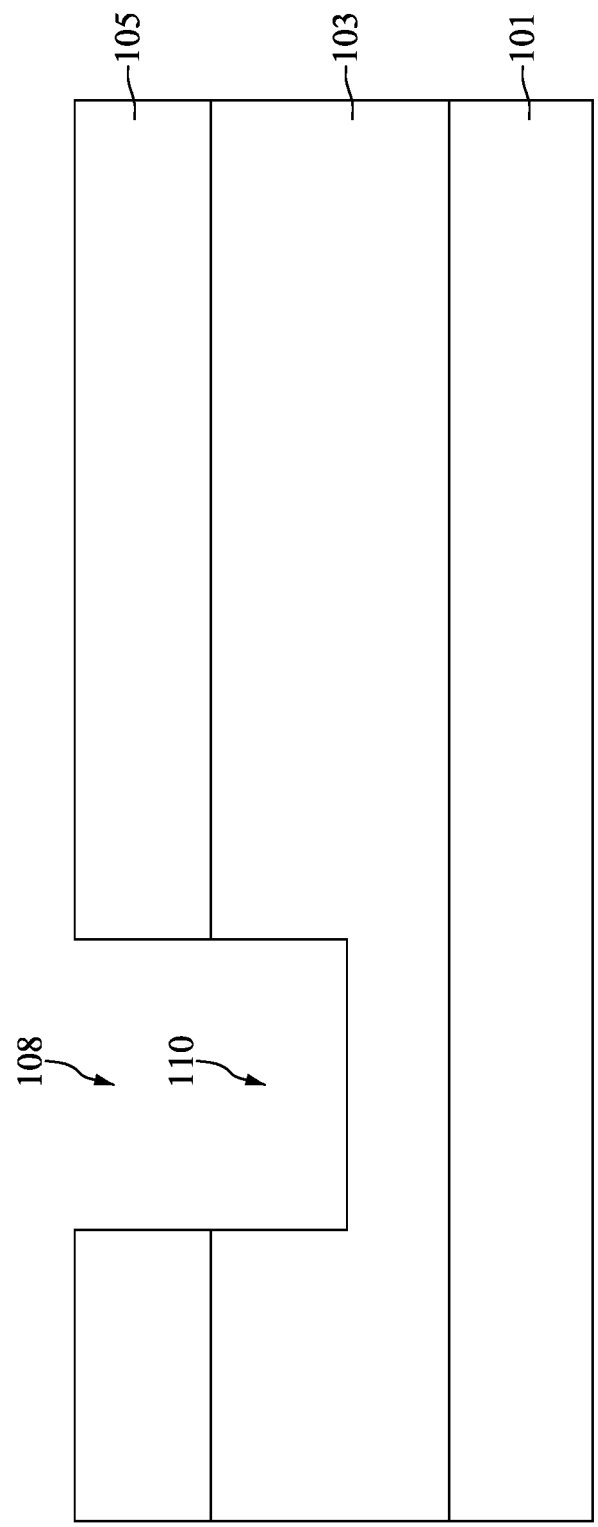
FIG. 4 is a cross-sectional view illustrating an intermediate stage of etching the first dielectric layer to form an opening using the patterned mask as a mask during the formation of the semiconductor device structure, in accordance with some embodiments.

Subsequently, an etching process is performed on the first dielectric layer 103 using the patterned mask 105 as a mask, such that an opening 110 (also referred to as a first opening) is formed in the first dielectric layer 103, as shown in FIG. 4 in accordance with some embodiments. The respective step is illustrated as the step S13 in the method 10 shown in FIG. 2. In some embodiments, the opening 110 do not penetrate through the first dielectric layer 103. The etching process may be a wet etching process, a dry etching process, or a combination thereof.

Figure 5:
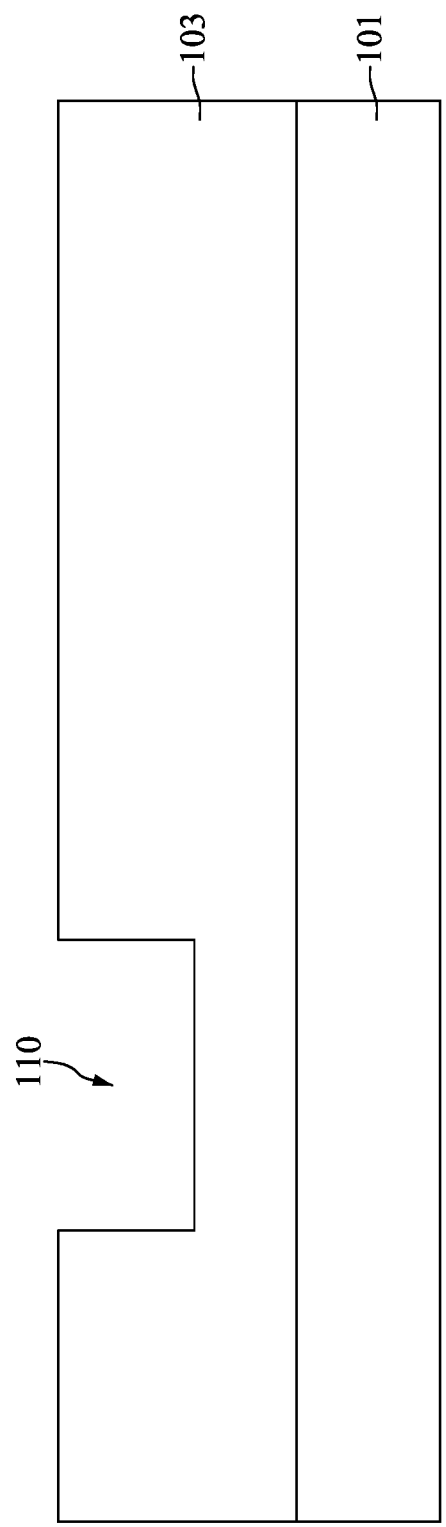
FIG. 5 is a cross-sectional view illustrating an intermediate stage of removing the patterned mask during the formation of the semiconductor device structure, in accordance with some embodiments.

After the opening 110 is formed in the first dielectric layer 103, the patterned mask 105 may be removed, as shown in FIG. 5 in accordance with some embodiments. In some embodiments, the patterned mask 105 is removed by a stripping process, an ashing process, an etching process, or another suitable process.

Figure 6:
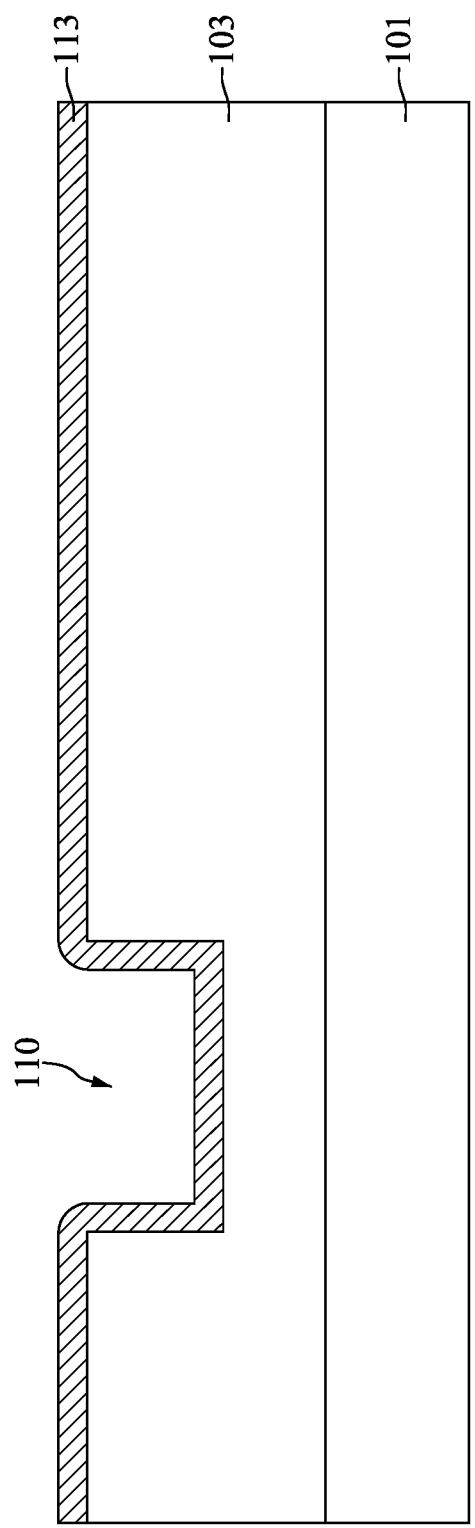
FIG. 6 is a cross-sectional view illustrating an intermediate stage of forming a barrier material lining the opening and over the first dielectric layer during the formation of the semiconductor device structure, in accordance with some embodiments.

Next, a barrier material 113 is formed lining the opening 110 and over the first dielectric layer 103, as shown in FIG. 6 in accordance with some embodiments. In some embodiments, the barrier material 113 is formed covering the sidewalls and the bottom surface of the opening 110. In some embodiments, the barrier material 113 includes tantalum (Ta), tantalum nitride (TaN), or a combination thereof. However, any other suitable materials, such as titanium (Ti), titanium nitride (TiN), cobalt tungsten (CoW), may be utilized. Moreover, the barrier material 113 may be formed by a deposition process, such as a CVD process, a PVD process, an ALD process, a metal organic chemical vapor deposition (MOCVD) process, a sputtering process, a plating process, or another suitable process.

Figure 7:
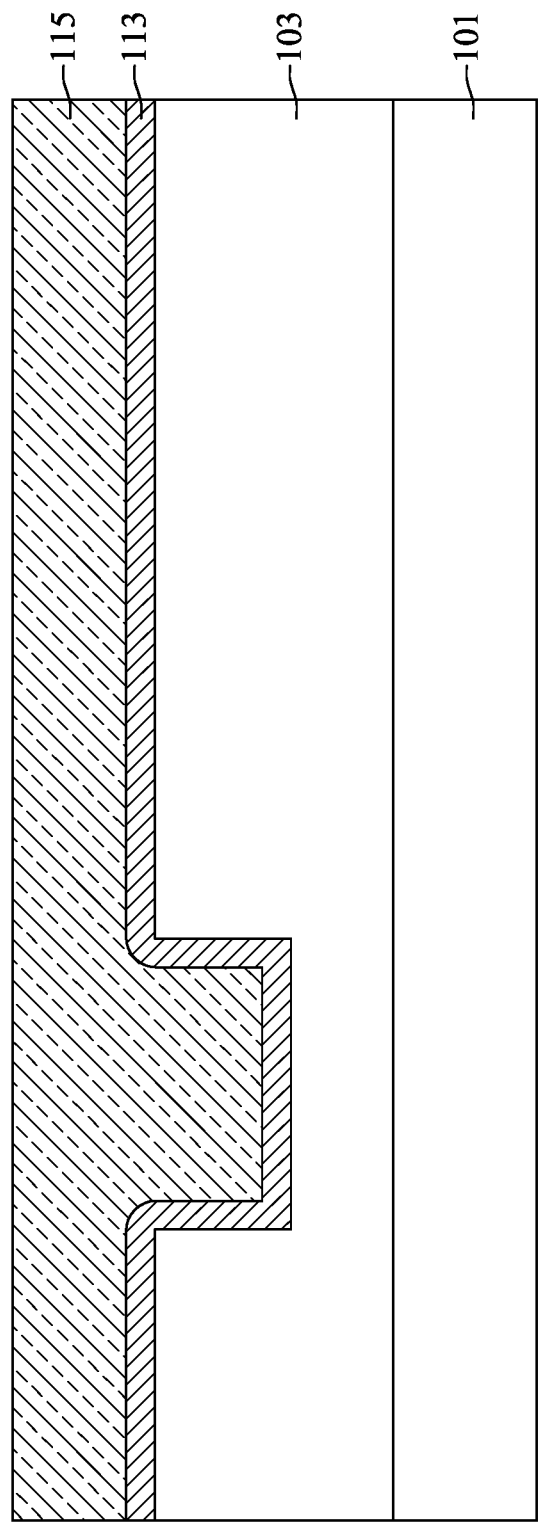
FIG. 7 is a cross-sectional view illustrating an intermediate stage of forming a conductive material in the opening and over the barrier material during the formation of the semiconductor device structure, in accordance with some embodiments.

Then, a conductive material 115 is formed over the barrier material 113 and filling a remaining portion of the opening 110, as shown in FIG. 7 in accordance with some embodiments. In some embodiments, the conductive material 115 includes copper (Cu). However, any other suitable materials, such as aluminum (Al), tungsten (W), titanium (Ti), tantalum (Ta), gold (Au), silver (Ag), may be utilized. Some processes used to form the conductive material 115 are similar to, or the same as those used to form the barrier material 113 and details thereof are not repeated herein.

Figure 8:
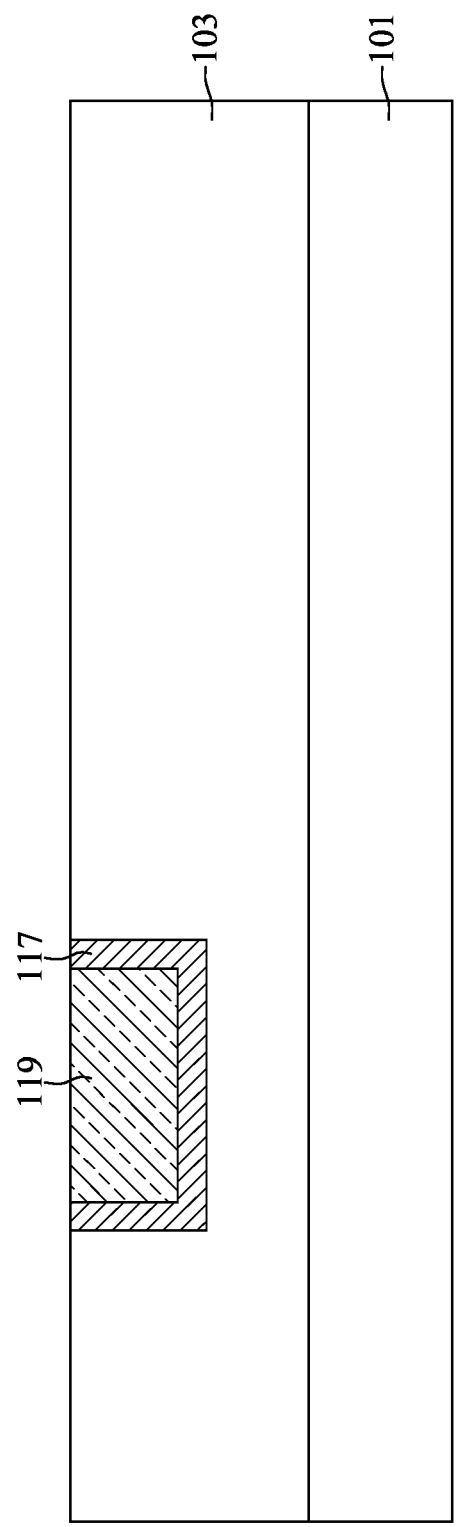
FIG. 8 is a cross-sectional view illustrating an intermediate stage of performing a planarization process to form a first barrier layer and a first conductive layer in the opening during the formation of the semiconductor device structure, in accordance with some embodiments.

Subsequently, a planarization process is performed on the barrier material 113 and the conductive material 115 until the first dielectric layer 103 is exposed, as shown in FIG. 8 in accordance with some embodiments. After the planarization process is performed, remaining portions of the barrier material 113 and the conductive material 115 form a first barrier layer 117 and a first conductive layer 119, respectively. In some embodiments, the opening 110 is filled by the first barrier layer 117 and the first conductive layer 119, and the first conductive layer 119 is surrounded by the first barrier layer 117. The planarization process may include a chemical mechanical polishing (CMP) process. The respective step is illustrated as the step S15 in the method 10 shown in FIG. 2.

Figure 9:
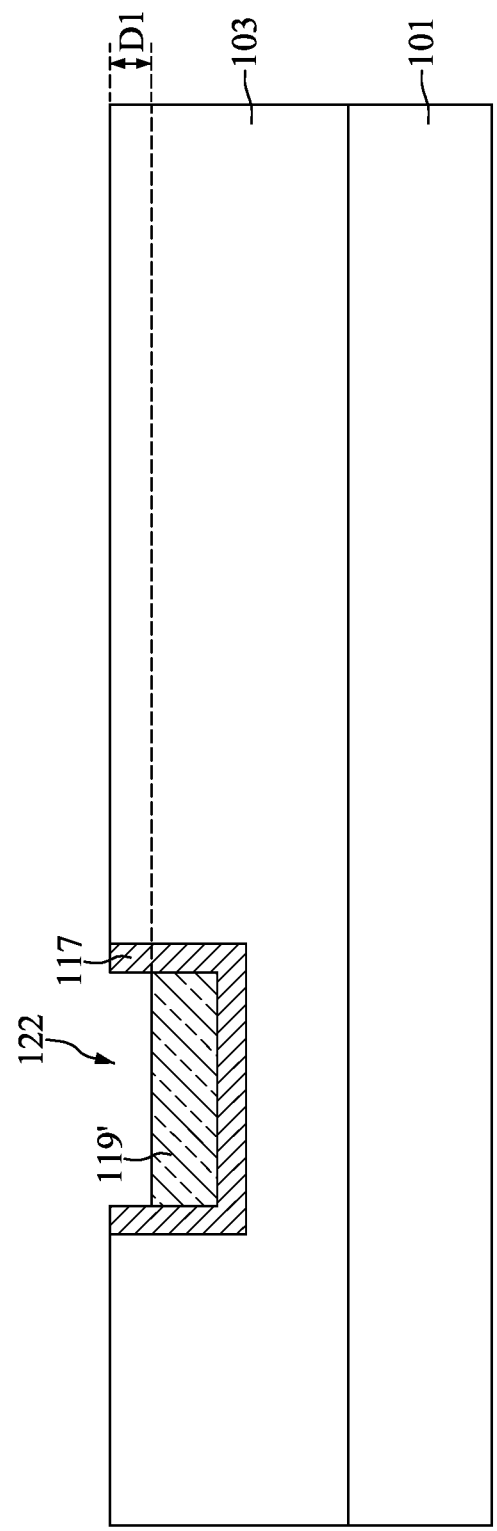
FIG. 9 is a cross-sectional view illustrating an intermediate stage of partially removing the first conductive layer to form a recess during the formation of the semiconductor device structure, in accordance with some embodiments.

Next, the first conductive layer 119 is partially removed to form a recess 122 over a remaining portion of the first conductive layer 119' (also referred to as a recessed first conductive layer 119'), as shown in FIG. 9 in accordance with some embodiments. The respective step is illustrated as the step S17 in the method 10 shown in FIG. 2. In some embodiments, an etching process is applied to partially remove (e.g., etch back) the first conductive layer 119 sufficiently so that the recess 122 with a depth D1 is formed over the recessed first conductive layer 119'. The etching process may include a dry etching process, a wet etching process, or a combination thereof.

Figure 10:
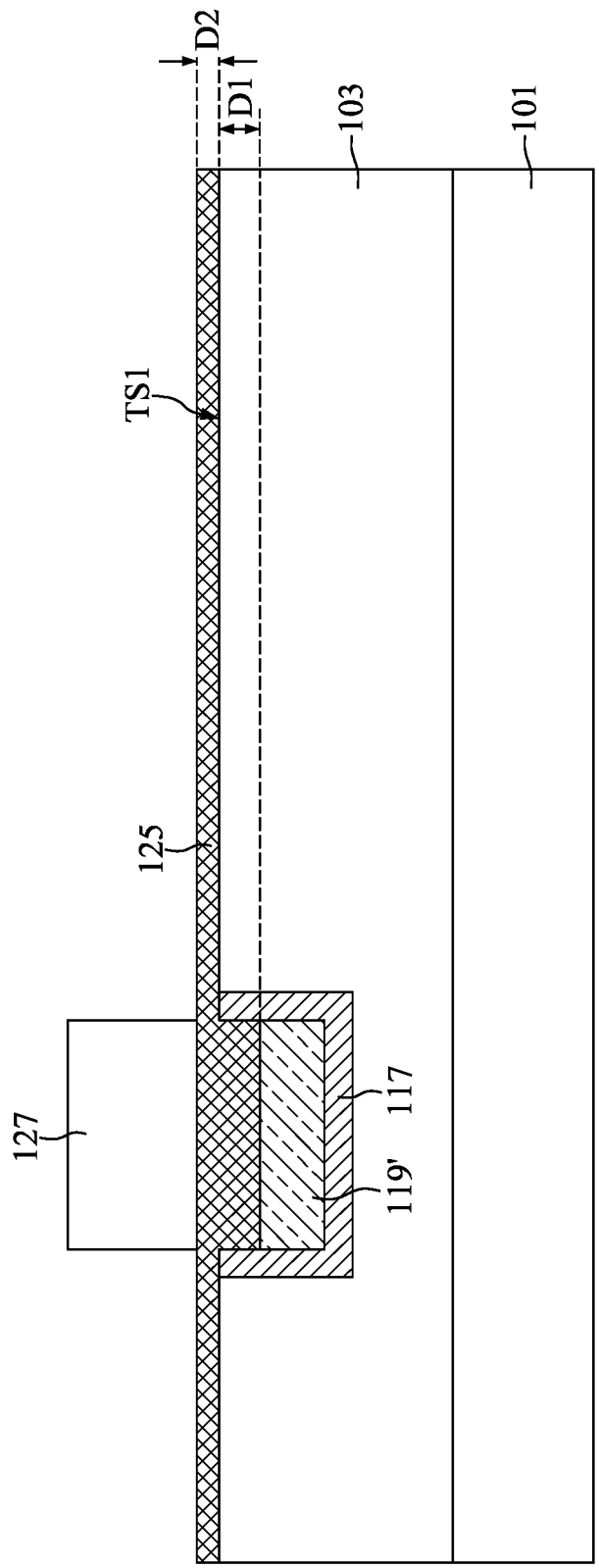
FIG. 10 is a cross-sectional view illustrating an intermediate stage of forming a cap material in the recess and over the first dielectric layer and forming a patterned mask over the cap material during the formation of the semiconductor device structure, in accordance with some embodiments.

Then, a cap material 125 is formed filling the recess 122 and extending over the top surface TS1 of the first dielectric layer 103, as shown in FIG. 10 in accordance with some embodiments. In some embodiments, the portion of the cap material 125 over the top surface TS1 of the first dielectric layer 103 has a depth D2, which is less than the depth D1 (i.e., the depth of the recess 122). In some embodiments, the cap material 125 includes, but not limited to, CuMg.

Some processes used to form the cap material 125 are similar to, or the same as those used to form the barrier material 113 and details thereof are not repeated herein. After the cap material 125 is formed, a patterned mask 127 is formed over the cap material 125. In some embodiments, the patterned mask 127 is formed directly over the first conductive layer 119'.

Figure 11:
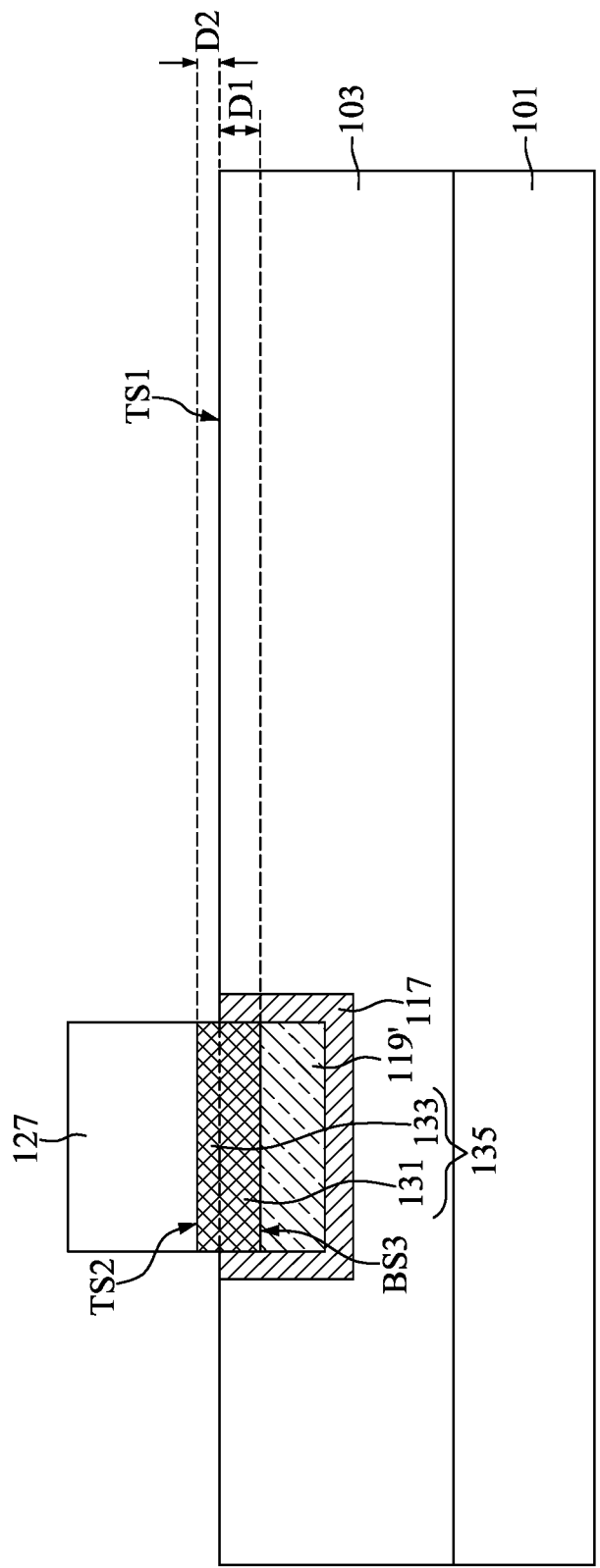
FIG. 11 is a cross-sectional view illustrating an intermediate stage of etching the cap material using the patterned mask as a mask during the formation of the semiconductor device structure, in accordance with some embodiments.

Subsequently, an etching process is performed on the cap material 125 using the patterned mask 127 as a mask, as shown in FIG. 11 in accordance with some embodiments. The etching process may include a dry etching process, a wet etching process, or a combination thereof. After the etching process is performed, a remaining cap material 135 is obtained.

In some embodiments, the remaining cap material 135 includes a first portion 131 and a second portion 133 disposed over the first portion 131. In some embodiments, the first portion 131 of the remaining cap material 135 is disposed (i.e., embedded) in the first dielectric layer 103, and the second portion 133 of the remaining cap material 135 protrudes over the top surface TS1 of the first dielectric layer 103. The first portion 131 of the remaining cap material 135 has a depth D1, which is defined as the distance between the bottom surface BS3 of the remaining cap material 135 and the top surface TS1 of the first dielectric layer 103, and the second portion 133 of the remaining cap material 135 has a depth D2, which is defined as the distance between the top surface TS2 of the remaining cap material 135 and the top surface TS1 of the first dielectric layer 103. In some embodiments, the depth D1 is greater than the depth D2. The respective step is illustrated as the step S19 in the method 10 shown in FIG. 2.

Figure 12:
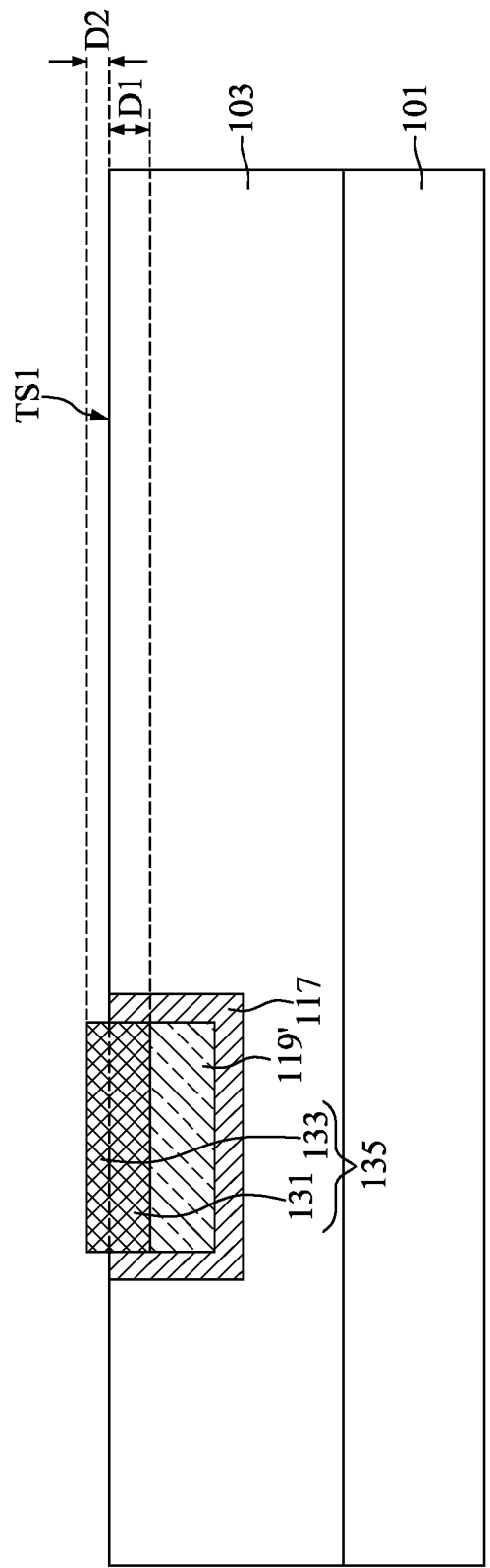
FIG. 12 is a cross-sectional view illustrating an intermediate stage of removing the patterned mask during the formation of the semiconductor device structure, in accordance with some embodiments.

After the cap material 125 is etched, the patterned mask 127 may be removed, as shown in FIG. 12 in accordance with some embodiments. In some embodiments, the patterned mask 127 is removed by a stripping process, an ashing process, an etching process, or another suitable process. In some embodiments, the second portion 133 of the remaining cap material 135 protrudes over the first dielectric layer 103.

Figure 13:
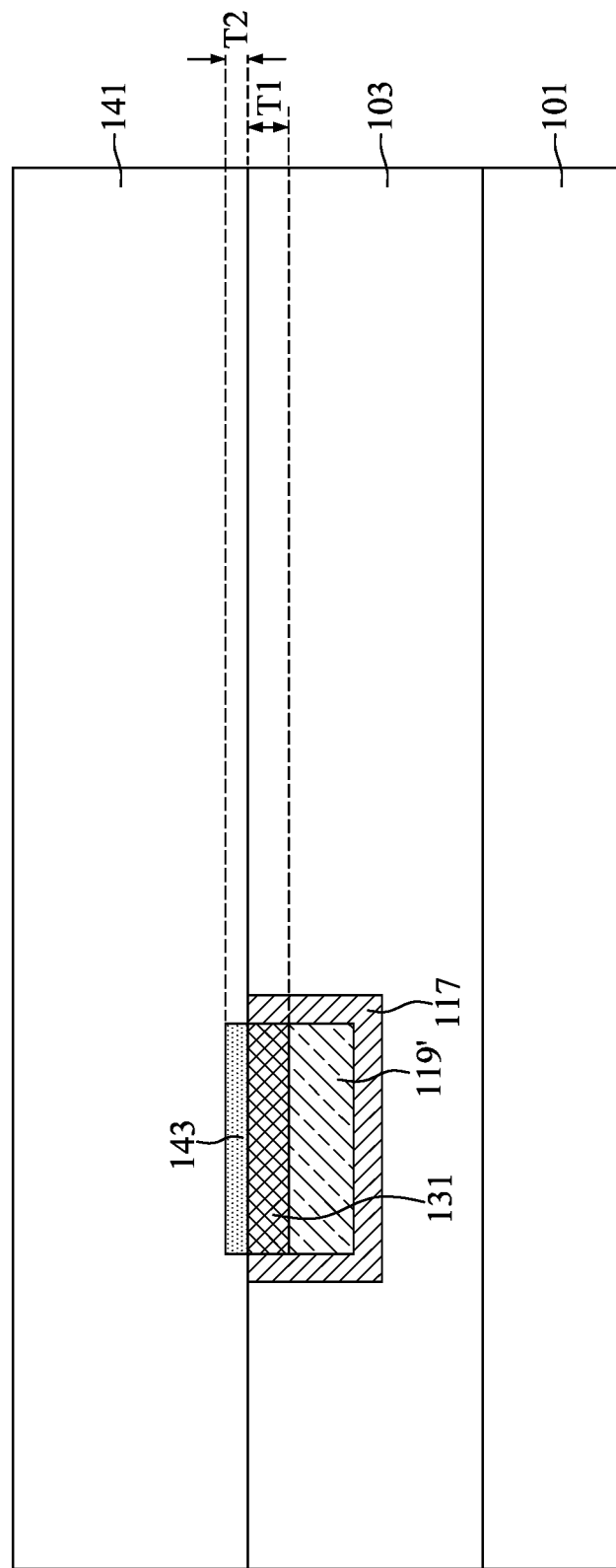
FIG. 13 is a cross-sectional view illustrating an intermediate stage of forming a second dielectric layer over a remaining cap material to convert a portion of the remaining cap material into a barrier portion during the formation of the semiconductor device structure, in accordance with some embodiments.

Next, a second dielectric layer 141 is formed over the first dielectric layer 103 and covering the remaining cap material 135, as shown in FIG. 13 in accordance with some embodiments. In some embodiments, the second portion 133 of the remaining cap material 135 (i.e., the portion of the remaining cap material 135 protruding from the first dielectric layer 103) is converted into a barrier portion 143 during the formation of the second dielectric layer 141. The respective step is illustrated as the step S21 in the method 10 shown in FIG. 2.

In some embodiments, the second dielectric layer 141 is made of silicon oxide, and the second portion 133 of the (remaining) cap material 135 protruding from the first dielectric layer 103 is oxidized to form the barrier portion 143 while the first portion 131 of the (remaining) cap material 135 (referred to as cap layer hereinafter) remains unoxidized. However, in some other embodiments, the second dielectric layer 141 is made of silicon nitride, silicon oxynitride, a low-k dielectric material or another suitable material. The second dielectric layer 141 may be formed by a deposition process, such as a CVD process, a PVD process, an ALD process, a spin-on coating process, or another suitable method. In some embodiments, the thickness T1 of the cap layer 131 is greater than the thickness T2 of the barrier portion 143.

Figure 14:
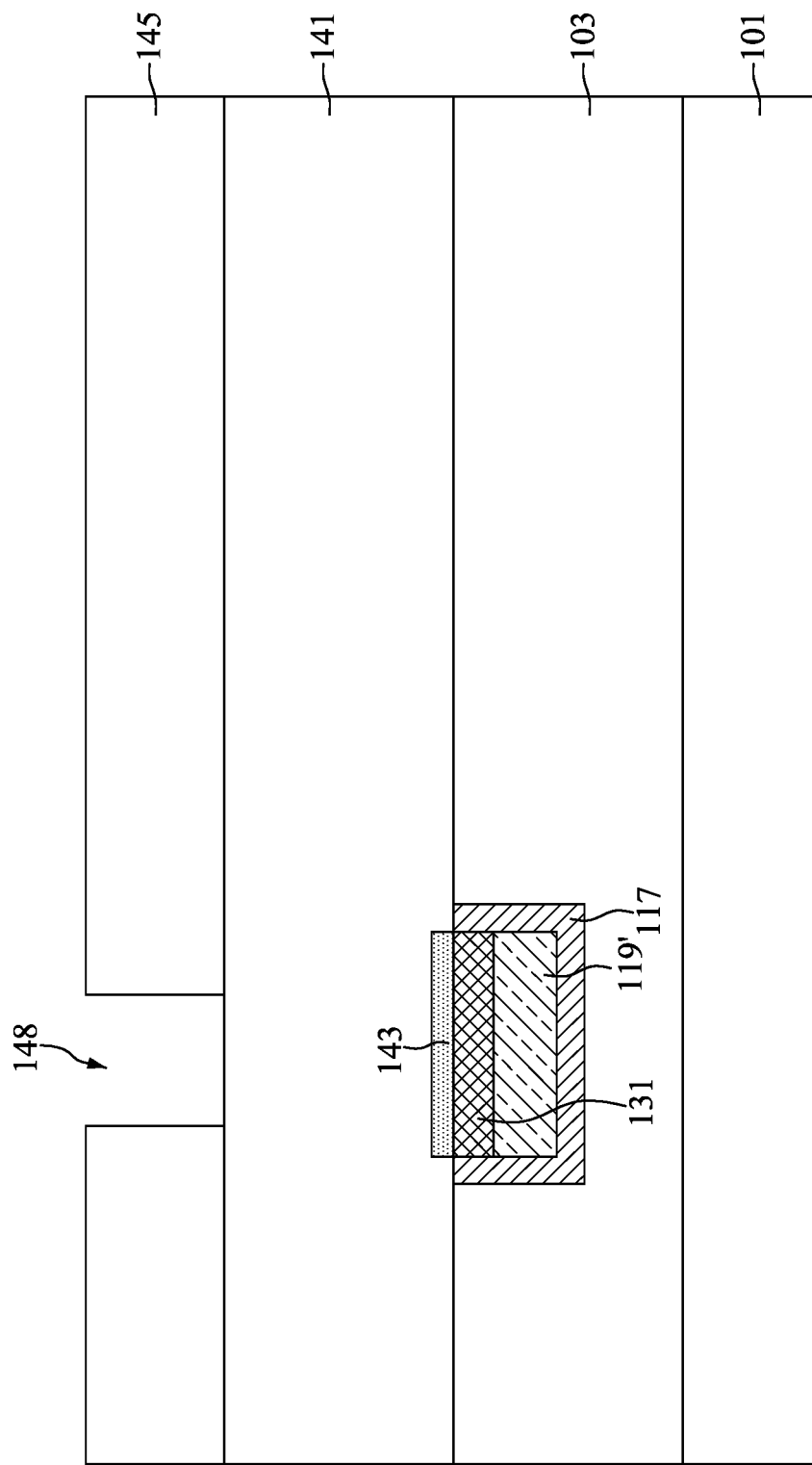
FIG. 14 is a cross-sectional view illustrating an intermediate stage of forming a patterned mask over the second dielectric layer during the formation of the semiconductor device structure, in accordance with some embodiments.

Then, a patterned mask 145 with an opening 148 is formed over the second dielectric layer 141, as shown in FIG. 14 in accordance with some embodiments. In some embodiments, the second dielectric layer 141 is partially exposed by the opening 148, and the second opening 148 is directly over the barrier portion 143. In some embodiments, the second dielectric layer 141 and the patterned mask 145 include different materials so that the etching selectivities may be different in the subsequent etching process.

Figure 15:
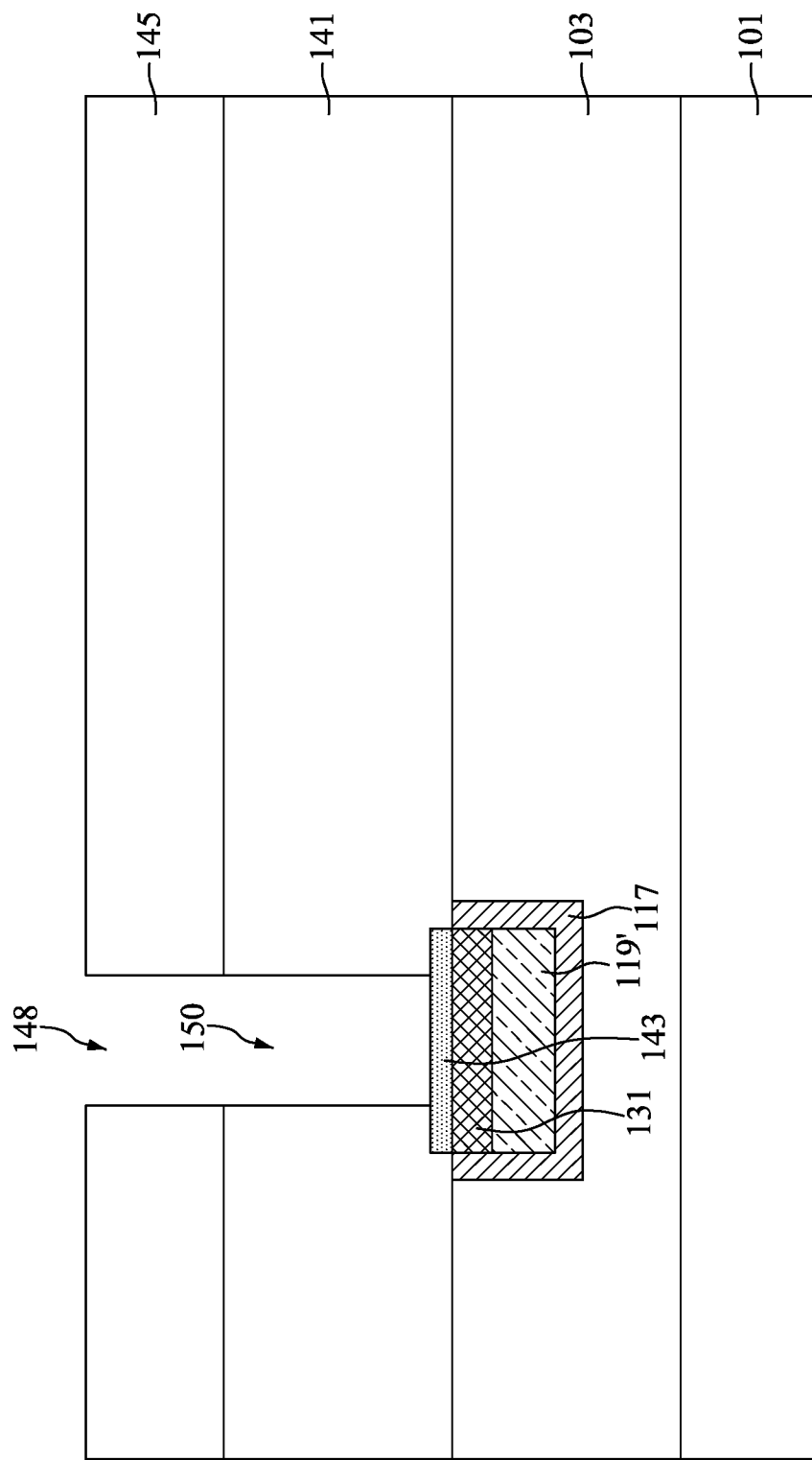
FIG. 15 is a cross-sectional view illustrating an intermediate stage of etching the second dielectric layer to form an opening using the patterned mask as a mask during the formation of the semiconductor device structure, in accordance with some embodiments.

Subsequently, an etching process is performed on the second dielectric layer 141 using the patterned mask 145 as a mask, such that an opening 150 (also referred to as a second opening) is formed in the second dielectric layer 141, as shown in FIG. 15 in accordance with some embodiments. In some embodiments, the barrier portion 143 is at least partially exposed by the opening 150. The respective step is illustrated as the step S23 in the method 10 shown in FIG. 2. The etching process may be a wet etching process, a dry etching process, or a combination thereof.

Figure 16:
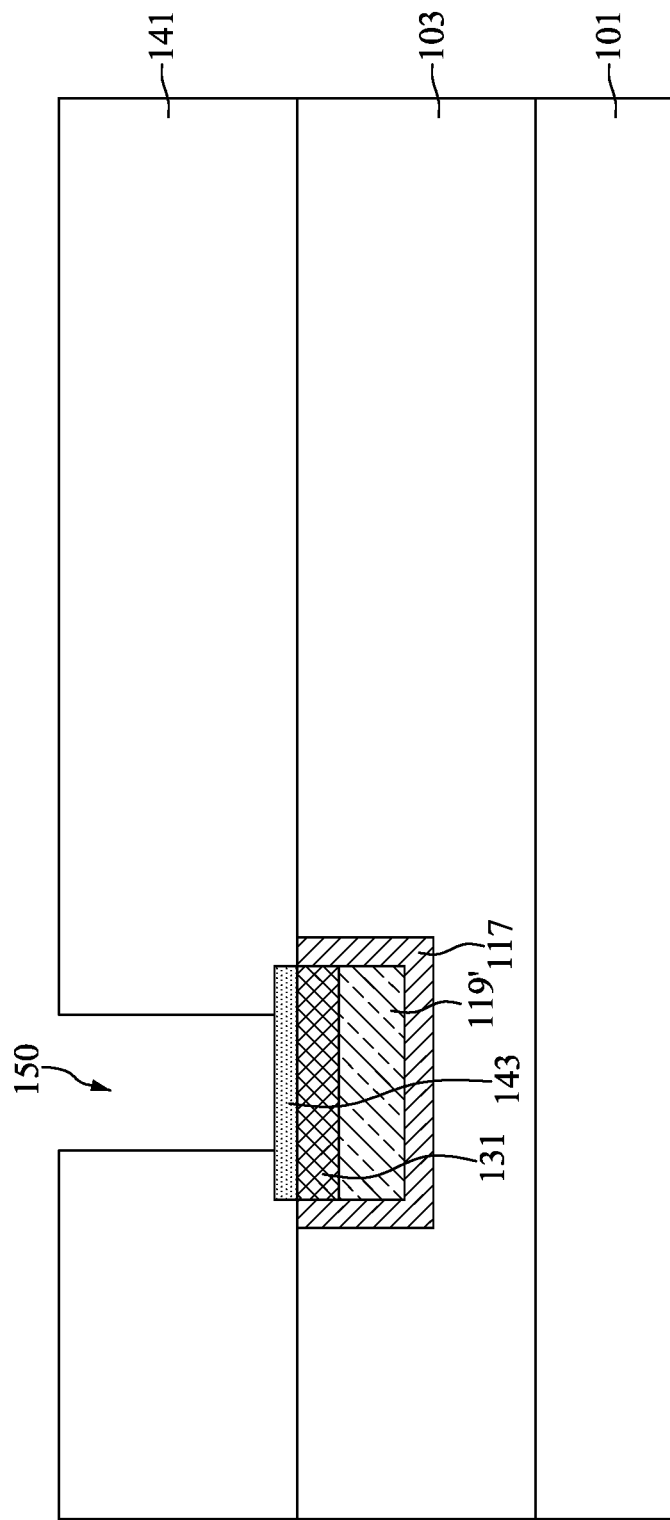
FIG. 16 is a cross-sectional view illustrating an intermediate stage of removing the patterned mask during the formation of the semiconductor device structure, in accordance with some embodiments.

After the opening 150 is formed in the second dielectric layer 141, the patterned mask 145 may be removed, as shown in FIG. 16 in accordance with some embodiments. In some embodiments, the patterned mask 145 is removed by a stripping process, an ashing process, an etching process, or another suitable process.

Figure 17:
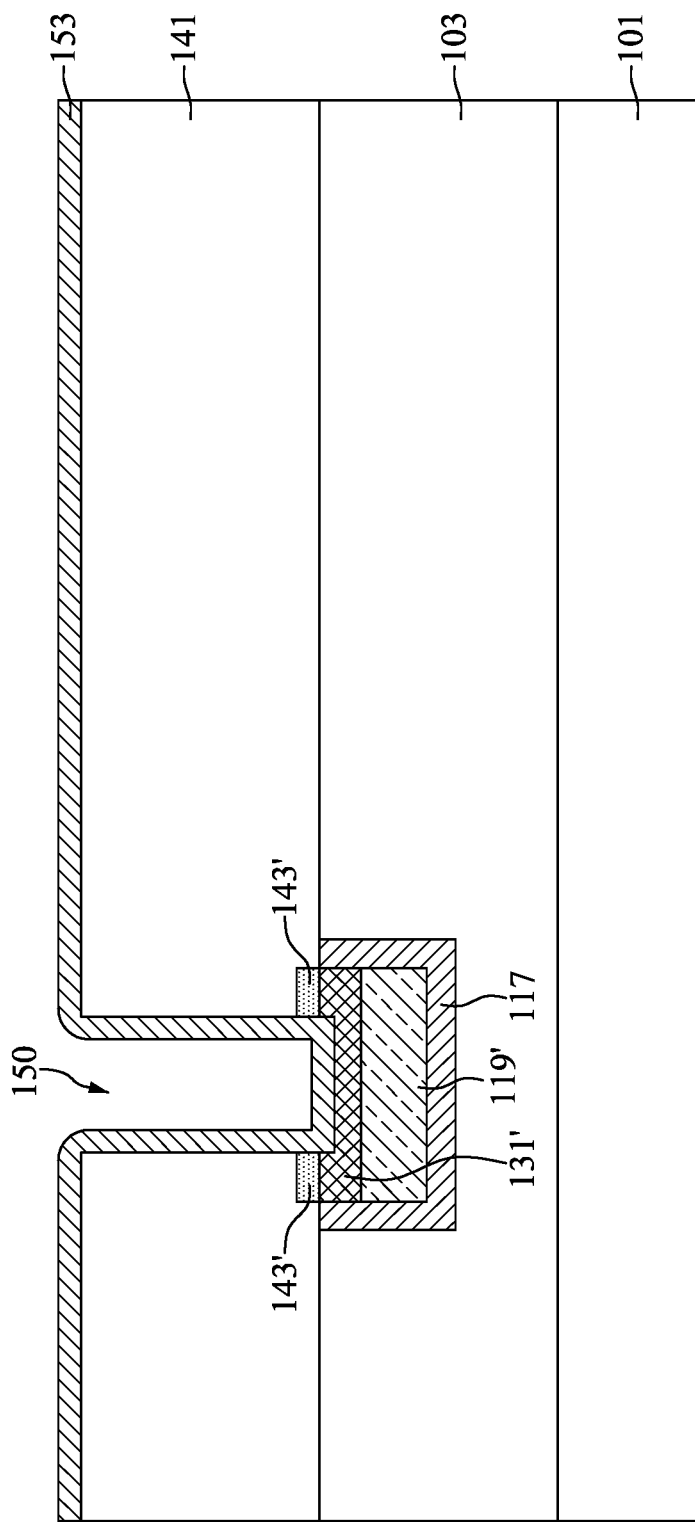
FIG. 17 is a cross-sectional view illustrating an intermediate stage of forming a barrier material lining the opening and over the second dielectric layer during the formation of the semiconductor device structure, in accordance with some embodiments.

Next, a barrier material 153 is formed lining the opening 150 and over the second dielectric layer 141, as shown in FIG. 17 in accordance with some embodiments. In some embodiments, the barrier portion 143 is partially removed during the formation of the barrier material 153 such that an etched barrier portion 143' is obtained. In some embodiments, the cap layer 131 is partially removed during the formation of the barrier material 153 such that an etched cap layer 143' is obtained.

In some embodiments, the barrier material 153 is formed covering the sidewalls and the bottom surface of the opening 150, and the barrier material 153 is in direct contact with the etched barrier portion 143' and the etched cap layer 131'. However, in some embodiments, during the step of forming the barrier material 153, the barrier portion 143 is partially removed, while the cap layer 131 remains substantially intact. Within the context of this disclosure, the word "substantially" means preferably at least 90%, more preferably 95%, even more preferably 98%, and most preferably 99%.

In some embodiments, the barrier material 153 includes titanium (Ti), titanium nitride (TiN), or a combination thereof. However, any other suitable materials, such as tantalum (Ta), tantalum nitride (TaN), cobalt tungsten (CoW), may be utilized. In some embodiments, the barrier material 153 is formed by a sputtering process, and the barrier portion 143 and the cap layer 131 are each partially removed during the sputtering process, such that the etched barrier portion 143' and the etched cap layer 131' are obtained, as shown in FIG. 17.

Figure 18:
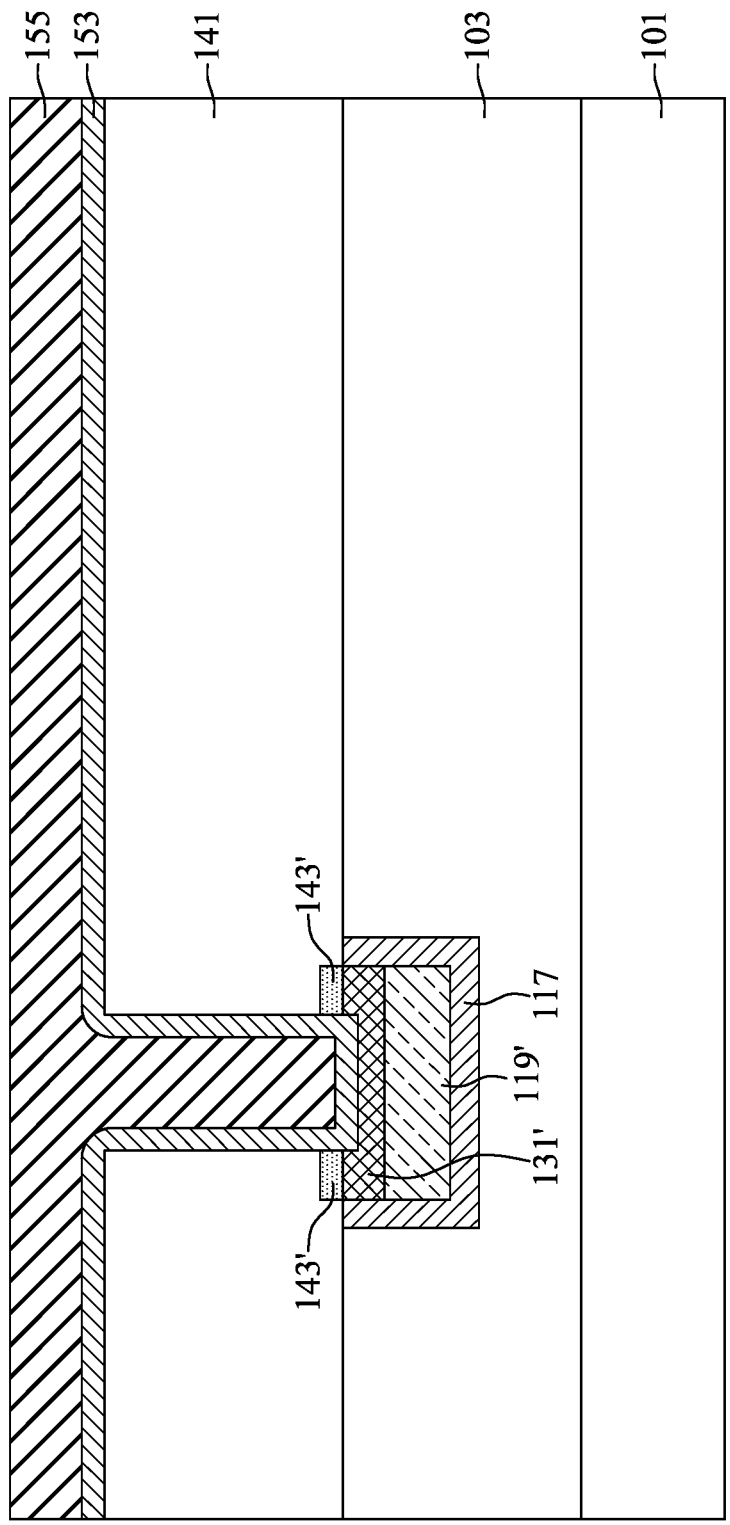
FIG. 18 is a cross-sectional view illustrating an intermediate stage of forming a conductive material in the opening and over the barrier material during the formation of the semiconductor device structure, in accordance with some embodiments.

Then, a conductive material 155 is formed over the barrier material 153 and filling a remaining portion of the opening 150, as shown in FIG. 18 in accordance with some embodiments. In some embodiments, the conductive material 155 includes tungsten (W). However, any other suitable materials, such as copper (Cu), aluminum (Al), titanium (Ti), tantalum (Ta), gold (Au), silver (Ag), may be utilized. Moreover, the conductive material 155 may be formed by a deposition process, such as a CVD process, a PVD process, an ALD process, an MOCVD process, a sputtering process, a plating process, or another suitable process.

Figure 19:
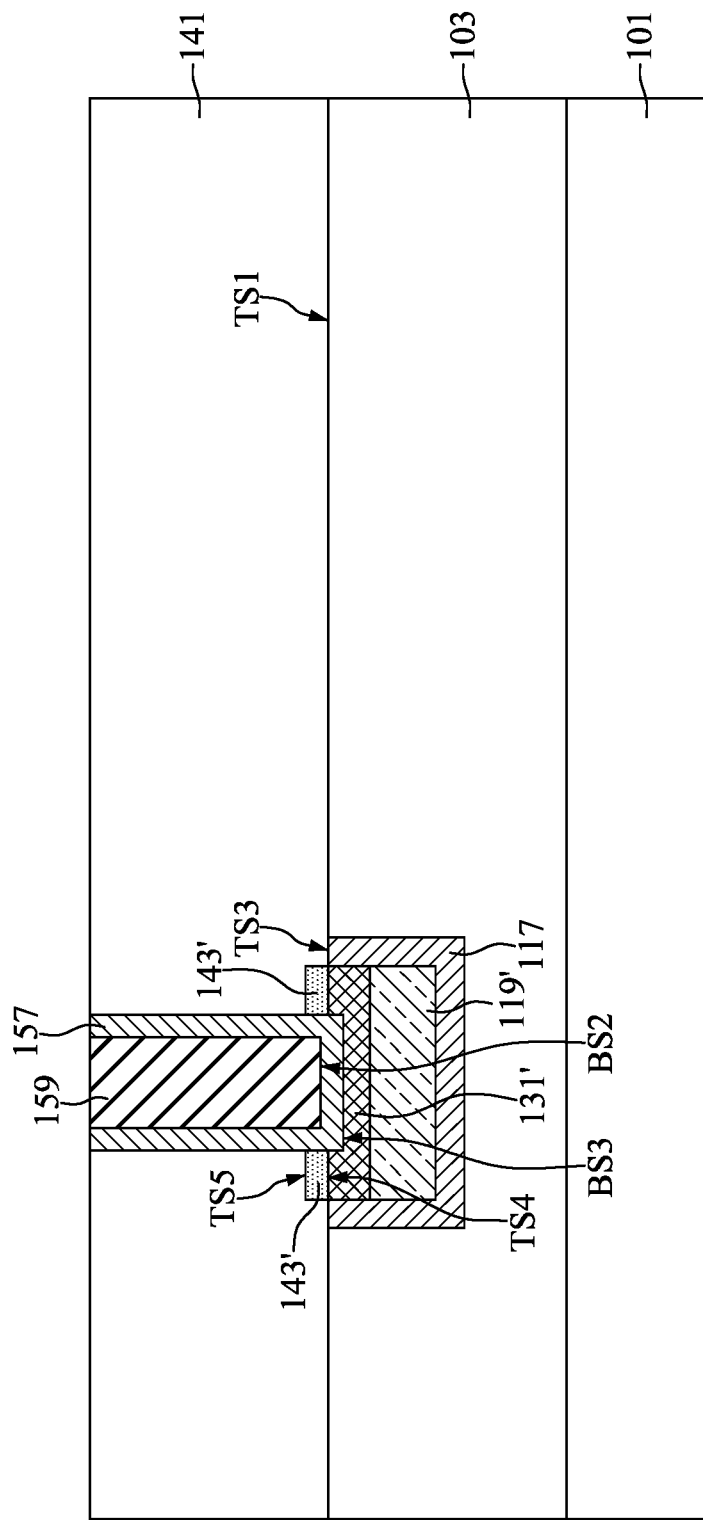
FIG. 19 is a cross-sectional view illustrating an intermediate stage of performing a planarization process to form a second barrier layer and a conductive plug in the opening during the formation of the semiconductor device structure, in accordance with some embodiments.

Subsequently, a planarization process is performed on the barrier material 153 and the conductive material 155 until the second dielectric layer 141 is exposed, as shown in FIG. 19 in accordance with some embodiments. After the planarization process is performed, remaining portions of the barrier material 153 and the conductive material 155 form a second barrier layer 157 and a conductive plug 159, respectively. In some embodiments, the opening 150 is filled by the second barrier layer 157 and the conductive plug 159, and the conductive plug 159 is surrounded by the second barrier layer 157. The planarization process may include a CMP process. The respective step is illustrated as the step S25 in the method 10 shown in FIG. 2.

In some embodiments, the top surface TS5 of the barrier portion 143' is higher than the top surface TS1 of the first dielectric layer 103. In some embodiments, the top surface TS3 of the first barrier layer 117 is substantially level with the top surface TS1 of the first dielectric layer 103. In some embodiments, the top surface TS5 of the barrier portion 143' is higher than the top surface TS3 of the first barrier layer 117.

Moreover, in some embodiments, the top surface TS5 of the barrier portion 143' is higher than the bottom surface BS3 of the second barrier layer 157. In some embodiments, the top surface TS5 of the barrier portion 143' is higher than the bottom surface BS2 of the conductive plug 159. In some embodiments, the top surface TS4 of the cap layer 131' is higher than the bottom surface BS3 of the second barrier layer 157. However, in some embodiments where the cap layer 131 remains substantially intact during the step of forming the second barrier layer 157, the top surface of the cap layer 131 is lower than, or substantially level with the bottom surface BS3 of the second barrier layer 157.

Figure 20:
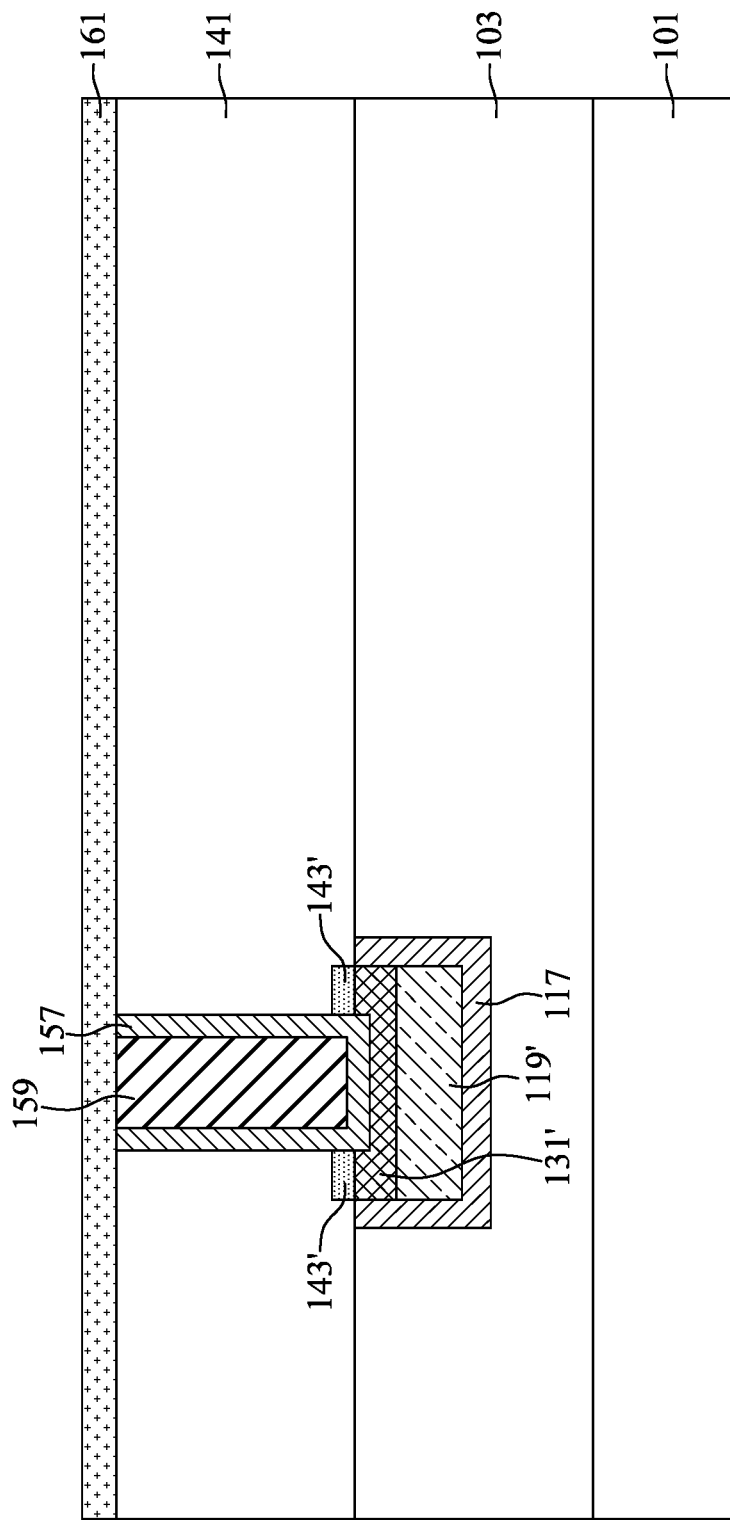
FIG. 20 is a cross-sectional view illustrating an intermediate stage of forming a barrier material over the second dielectric layer and covering the conductive plug during the formation of the semiconductor device structure, in accordance with some embodiments.

After the second barrier layer 157 and the conductive plug 159 are formed, a barrier material 161 is formed over the second dielectric layer 141 and covering the second barrier layer 157 and the conductive plug 159, as shown in FIG. 20 in accordance with some embodiments. In some embodiments, the barrier material 161 is formed in direct contact with the second barrier layer 157 and the conductive plug 159.

In some embodiments, the barrier material 161 includes titanium (Ti), titanium nitride (TiN), or a combination thereof. However, any other suitable materials, such as tantalum (Ta), tantalum nitride (TaN), cobalt tungsten (CoW), may be utilized. In addition, the barrier material 161 may be formed by a deposition process, such as a CVD process, a PVD process, an ALD process, an MOCVD process, a sputtering process, a plating process, or another suitable process.

Figure 21:
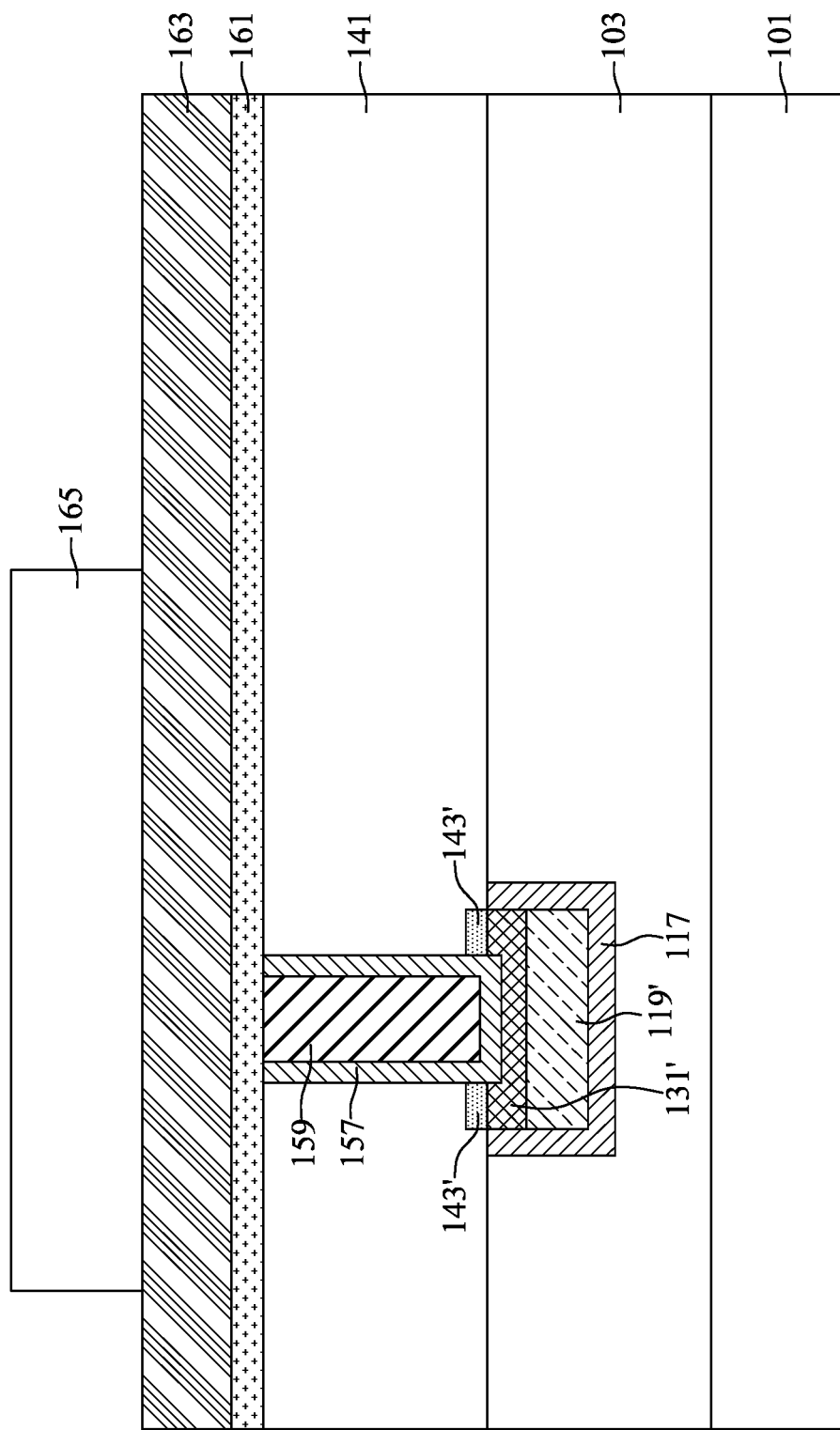
FIG. 21 is a cross-sectional view illustrating an intermediate stage of sequentially forming a conductive material and a patterned mask over the barrier material during the formation of the semiconductor device structure, in accordance with some embodiments.

Next, a conductive material 163 is formed over the barrier material 161, as shown in FIG. 21 in accordance with some embodiments. In some embodiments, the conductive material 163 includes aluminum (Al), copper (Cu), or a combination thereof. However, any other suitable materials, such as tungsten (W), titanium (Ti), tantalum (Ta), gold (Au), silver (Ag), may be utilized. Some processes used to form the conductive material 163 are similar to, or the same as those used to form the barrier material 161 and details thereof are not repeated herein. In some embodiments, a patterned mask 165 is formed over the conductive material 163 as shown in FIG. 21.

Figure 22:
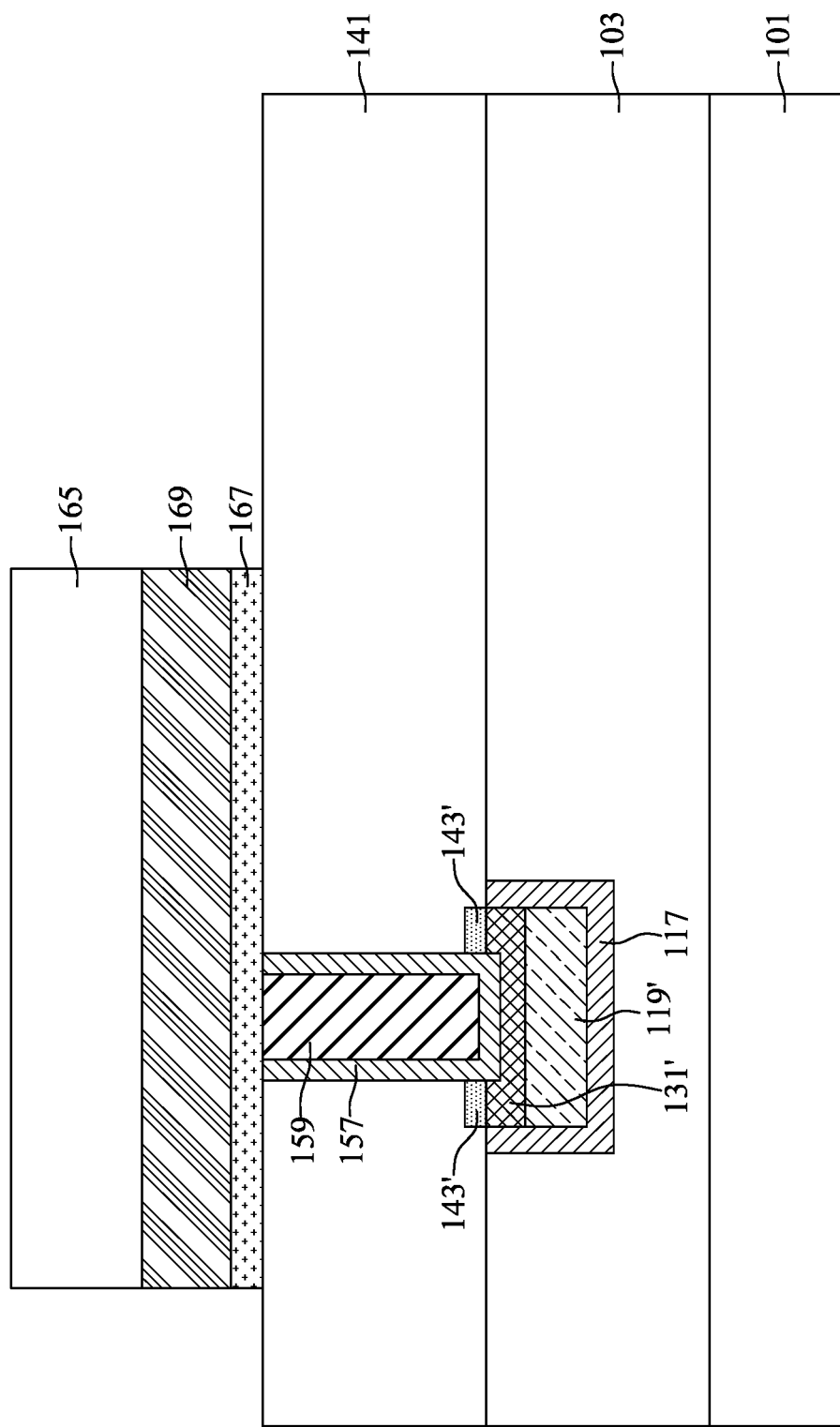
FIG. 22 is a cross-sectional view illustrating an intermediate stage of etching the barrier material and the conductive material using the patterned mask as a mask to form a third barrier layer and a second conductive layer during the formation of the semiconductor device structure, in accordance with some embodiments.

Then, an etching process is performed on the conductive material 163 and the barrier material 161 using the patterned mask 165 as a mask, as shown in FIG. 22 in accordance with some embodiments. The etching process may include a dry etching process, a wet etching process, or a combination thereof. After the etching process is performed, a third barrier layer 167 (i.e., the remaining portion of the barrier material 161) and a second conductive layer 169 (i.e., the remaining portion of the conductive material 163) over the third barrier layer 167 are obtained. The respective step is illustrated as the step S27 in the method 10 shown in FIG. 2.

After the third barrier layer 167 and the second conductive layer 169 are obtained, the patterned mask 165 may be removed, and the semiconductor device structure 100 is obtained, as shown in FIG. 1 in accordance with some embodiments. In some embodiments, the patterned mask 165 is removed by a stripping process, an ashing process, an etching process, or another suitable process. In some embodiments, the conductive plug 159 in the second dielectric layer 141 electrically connecting the second conductive layer 169 to the first conductive layer 119'.

In some embodiments, the material of the barrier portion 143' is selected to have a low contact resistivity. For example, the barrier portion 143' includes CuMgO, and the contact resistivity of CuMgO is lower than the contact resistivity of tantalum (Ta). Therefore, a conductive path through the cap layer 131' exhibits improved electrical connectivity, which lead to a better performance to efficiently transit signals. As a result, the performance of the semiconductor device structure 100 can be improved.

Embodiments of the semiconductor device structure (e.g., the semiconductor device structure 100) and method for preparing the same are provided in the disclosure. In some embodiments, the semiconductor device structure includes a first conductive layer (e.g., the first conductive layer 119') disposed in a first dielectric layer (e.g., the first dielectric layer 103), a cap layer (e.g., the cap layer 131') disposed over the first conductive layer, and a first barrier layer (e.g., the first barrier layer 117) separating the first conductive layer and the cap layer from the first dielectric layer. In some embodiments, the semiconductor device structure also includes a barrier portion (e.g., the barrier portion 143') disposed over the cap layer. The barrier portion may function as a diffusion barrier to eliminate the diffusion and reaction between the cap layer and a second dielectric layer (e.g., the second dielectric layer 141) over the barrier portion. Since the material of the barrier portion may be selected to have a low contact resistivity, such as lower than the contact resistivity of tantalum (Ta), a conductive path through the cap layer exhibits improved electrical connectivity. As a result, the performance of the semiconductor device structure can be improved.

In one embodiment of the present disclosure, a semiconductor device structure is provided. The semiconductor device structure includes a first dielectric layer disposed over a semiconductor substrate, and a first conductive layer disposed in the first dielectric layer. The semiconductor device structure also includes a cap layer disposed over the first conductive layer, and a first barrier layer separating the first conductive layer and the cap layer from the first dielectric layer. The semiconductor device structure further includes a barrier portion disposed over the cap layer, wherein the barrier portion includes CuMgO, and a second dielectric layer disposed over the first dielectric layer and covering the barrier portion. In addition, the semiconductor device structure includes a conductive plug disposed over the cap layer and surrounded by the second dielectric layer. A bottom portion of the conductive plug is surrounded by the barrier portion.

In another embodiment of the present disclosure, a semiconductor device structure is provided. The semiconductor device structure includes a first dielectric layer disposed over a semiconductor substrate, and a first conductive layer disposed in the first dielectric layer. The semiconductor device structure also includes a first barrier layer covering sidewalls and a bottom surface of the first conductive layer, and a cap layer disposed over the first conductive layer and surrounded by the first barrier layer. The semiconductor device is structure further includes a barrier portion disposed over the cap layer, and a second dielectric layer disposed over the first dielectric layer and covering the barrier portion. In addition, the semiconductor device structure includes a second conductive layer disposed over the second dielectric layer, and a conductive plug disposed in the second dielectric layer electrically connecting the second conductive layer to the first conductive layer.

In yet another embodiment of the present disclosure, a method for preparing a semiconductor device structure is provided. The method includes forming a first dielectric layer over a semiconductor substrate, and forming a first opening in the first dielectric layer. The method also includes forming a first conductive layer and a first barrier layer in the first opening. The first conductive layer is separated from the first dielectric layer by the first barrier layer. The method further includes partially removing the first conductive layer to form a recess, and filling the recess with a cap material. A portion of the cap material protrudes from the first dielectric layer. In addition, the method includes forming a second dielectric layer over the first dielectric layer. The portion of the cap material is converted into a barrier portion during the forming the second dielectric layer.

The embodiments of the present disclosure have some advantageous features. In some embodiments, the semiconductor device structure includes a barrier portion disposed over a cap layer and separating the cap layer from an overlying dielectric layer. By selecting the material of the barrier portion to have a low contact resistivity (e.g., lower than the contact resistivity of tantalum (Ta)), a conductive path through the cap layer exhibits improved electrical connectivity. As a result, the performance of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a first dielectric layer disposed over a semiconductor substrate;
   a first conductive layer disposed in the first dielectric layer;
   a cap layer disposed over the first conductive layer;
   a first barrier layer separating the first conductive layer and the cap layer from the first dielectric layer;
   a barrier portion disposed over the cap layer, wherein the barrier portion includes CuMgO;
   a second dielectric layer disposed over the first dielectric layer and covering the barrier portion;
   a conductive plug disposed over the cap layer and surrounded by the second dielectric layer, wherein a bottom portion of the conductive plug is surrounded by the barrier portion;
   a second barrier layer separating the conductive plug from the second dielectric layer; and
   a third barrier layer disposed over the second dielectric layer and covering the second barrier layer and the conductive plug.

2. The semiconductor device structure of claim 1, wherein a bottom surface and sidewalls of the first conductive layer are covered by the first barrier layer, and the first barrier layer includes Ta, TaN, or a combination thereof.

3. The semiconductor device structure of claim 1, wherein the cap layer is disposed in the first dielectric layer.

4. The semiconductor device structure of claim 1, wherein the cap layer includes CuMg, and the cap layer is in direct contact with the barrier portion.

5. The semiconductor device structure of claim 1, wherein the cap layer is separated from the first dielectric layer and the second dielectric layer.

6. The semiconductor device structure of claim 1, wherein a top surface of the barrier portion is higher than a top surface of the first dielectric layer.

7. The semiconductor device structure of claim 1, wherein the second barrier layer and the third barrier layer include Ti, TiN, or a combination thereof.

8. The semiconductor device structure of claim 1, wherein the second barrier layer is in direct contact with the barrier portion and the cap layer.

9. The semiconductor device structure of claim 1, further comprising:
   a second conductive layer disposed over the third barrier layer, wherein the second conductive layer is electrically connected to the first conductive layer.

10. A semiconductor device structure, comprising:
    a first dielectric layer disposed over a semiconductor substrate;
    a first conductive layer disposed in the first dielectric layer;
    a first barrier layer covering sidewalls and a bottom surface of the first conductive layer;
    a cap layer disposed over the first conductive layer and surrounded by the first barrier layer;
    a barrier portion disposed over the cap layer;
    a second dielectric layer disposed over the first dielectric layer and covering the barrier portion;
    a second conductive layer disposed over the second dielectric layer; and
    a conductive plug disposed in the second dielectric layer electrically connecting the second conductive layer to the first conductive layer; and
    a second barrier layer covering sidewalls and a bottom surface of the conductive plug, wherein the second barrier layer is in direct contact with the barrier portion and the cap layer;

wherein a top surface of the barrier portion is higher than a bottom surface of the second barrier layer.

11. The semiconductor device structure of claim 10, wherein a thickness of the cap layer is greater than a thickness of the barrier portion.

12. The semiconductor device structure of claim 10, wherein the first barrier layer and the barrier portion include different materials.

13. The semiconductor device structure of claim 10, wherein a top surface of the barrier portion is higher than a top surface of the first barrier layer.

14. The semiconductor device structure of claim 10, wherein the cap layer includes CuMg, and the barrier portion includes CuMgO.

15. The semiconductor device structure of claim 10, further comprising:
   a third barrier layer separating the second conductive layer from the second dielectric layer, wherein the conductive plug and the second barrier layer are covered by and in direct contact with the third barrier layer.

16. The semiconductor device structure of claim 10, wherein the top surface of the barrier portion is higher than a bottom surface of the conductive plug.

17. The semiconductor device structure of claim 10, wherein a top surface of the cap layer is higher than the bottom surface of the second barrier layer.

* * * * *